United States Patent
Kashiwakura

(10) Patent No.: US 9,859,603 B2
(45) Date of Patent: Jan. 2, 2018

(54) PRINTED WIRING BOARD, ELECTRONIC DEVICE, AND WIRING CONNECTION METHOD

(71) Applicant: NEC Corporation, Tokyo (JP)

(72) Inventor: Kazuhiro Kashiwakura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/762,321

(22) PCT Filed: Jan. 8, 2014

(86) PCT No.: PCT/JP2014/050148
§ 371 (c)(1),
(2) Date: Jul. 21, 2015

(87) PCT Pub. No.: WO2014/115578
PCT Pub. Date: Jul. 31, 2014

(65) Prior Publication Data
US 2015/0359084 A1    Dec. 10, 2015

(30) Foreign Application Priority Data

Jan. 24, 2013  (JP) .................................. 2013-010899

(51) Int. Cl.
*H01P 3/08* (2006.01)
*H05K 1/02* (2006.01)
(Continued)

(52) U.S. Cl.
CPC .............. *H01P 3/082* (2013.01); *H01P 3/026* (2013.01); *H05K 1/0224* (2013.01);
(Continued)

(58) Field of Classification Search
CPC .. H05K 1/0222; H05K 1/0225; H05K 1/0227; H05K 1/115; H05K 1/116;
(Continued)

(56) References Cited

U.S. PATENT DOCUMENTS

| | | |
|---|---|---|
| 2006/0255876 A1 | 11/2006 | Kushta et al. |
| 2008/0093112 A1 | 4/2008 | Kushta |

(Continued)

FOREIGN PATENT DOCUMENTS

| | | |
|---|---|---|
| CN | 101176391 A | 5/2008 |
| JP | 2007-035710 A | 2/2007 |
| JP | 2007-141975 A | 6/2007 |
| JP | 2007-522679 A | 8/2007 |
| JP | 2007-258589 A | 10/2007 |
| JP | 2008-507858 | 3/2008 |
| JP | 2008-119826 A | 5/2008 |
| JP | 2008-130976 A | 6/2008 |
| JP | 2010-073891 A | 4/2010 |

(Continued)

OTHER PUBLICATIONS

International Search Report dated Feb. 4, 2014 in PCT/JP2014/050148 with English-language translation (4 pgs.).

(Continued)

*Primary Examiner* — Rakesh Patel
(74) *Attorney, Agent, or Firm* — Foley & Lardner LLP

(57) ABSTRACT

A printed wiring board is provided with a wiring layer, a first ground layer, a second ground layer, a grounding through-hole, a signal through-hole, a first clearance, and a second clearance. The wiring layer has a signal line. The first ground layer has a first ground plane. The second ground layer is positioned between the wiring layer and the first ground layer and has a second ground plane. The grounding through-hole passes through the wiring layer, the first ground layer, and the second ground layer and is connected to the second ground plane. The signal through-hole passes through the wiring layer, the first ground layer, and the second ground layer and is connected to the signal line. The first clearance is formed in the first ground layer, is positioned in the vicinity of the signal through-hole and the grounding through-hole, and separates the first ground plane from the signal through-hole and the grounding through-hole. The second clearance is formed in the second ground layer, is positioned in the vicinity of the signal through-hole, and separates the second ground plane from the signal through-hole.

6 Claims, 11 Drawing Sheets

(51) Int. Cl.
   *H01P 3/02*   (2006.01)
   *H05K 1/11*   (2006.01)
   *H05K 3/42*   (2006.01)
(52) U.S. Cl.
   CPC ......... *H05K 1/0251* (2013.01); *H05K 1/0253* (2013.01); *H05K 1/116* (2013.01); *H05K 3/429* (2013.01); *H05K 1/0245* (2013.01); *H05K 2201/09718* (2013.01); *Y10T 29/49167* (2015.01)
(58) Field of Classification Search
   CPC ....... H05K 1/0251; H01P 3/081; H01P 3/026; H01P 3/18; H01P 5/028
   USPC .................................. 333/246, 238; 361/736
   See application file for complete search history.

(56) References Cited

U.S. PATENT DOCUMENTS

| | | |
|---|---|---|
| 2008/0121421 A1 | 5/2008 | Kashiwakura |
| 2009/0133913 A1 | 5/2009 | Kushta et al. |
| 2010/0065321 A1 | 3/2010 | Kashiwakura |

FOREIGN PATENT DOCUMENTS

| | | |
|---|---|---|
| WO | WO 2004/107830 A1 | 12/2004 |
| WO | WO 2007/046271 A1 | 4/2007 |

OTHER PUBLICATIONS

First Office Action dated Sep. 1, 2016 in related Chinese Appl. 201480005938.0 with English-language translation (21 pgs.).

PRINTED WIRING BOARD, ELECTRONIC DEVICE, AND WIRING CONNECTION METHOD

TECHNICAL FIELD

The present invention relates to a printed wiring board mainly used in transmission of high-frequency differential signals, an electronic device, and a wiring connection method.

BACKGROUND ART

Many of recent electronic devices improve an integration degree in a circuit by using a printed wiring board in which a plurality of insulating layers and a plurality of conductive layers (wiring layers) are stacked. In this case, a wiring formed in each wiring layer is usually connected to a hole penetrating all layers in the board, by a conductor (referred to as a "through-hole" in the following) with which the inner surface of the hole is plated.

In the field of data communication such as Ethernet (Registered Trademark), a data forwarding speed becomes higher year by year. Recently, particularly, to increase a speed of transmitting an electric signal, differential signals, e.g., have been used. This is an idea for reducing influence of a noise from an outside, and maintaining completeness of a high-frequency electric signal that propagates through a transmission path.

As a higher frequency is advanced, an electric signal is more affected by discontinuity of impedance in a transmission line (wiring). As a result, the tendency that a loss of a signal, a noise, and a cross talk between wirings occur becomes high. Accordingly, to maintain electric performance obtained by a signal using a high frequency, it is desired to make impedance substantially constant over an entire transmission line.

However, a through-hole formed in the above-described printed wiring board penetrates the printed wiring board entirely. For this reason, a parasitic stub will be formed at a connection point with a signal wiring formed in a wiring layer. It is known that this parasitic stub produces discontinuity of impedance in the transmission line, and becomes a factor of a signal loss and the like. 10 Gbase-KR defined in IEEE802.3ap is Ethernet (Registered Trademark) disposed via a backplane. It is known that in the case of 10 Gbase-KR, a loss caused by a stub parasitic on a through-hole for mounting a backplane connector is particularly large.

FIG. 9 is a first diagram illustrating a configuration of a printed wiring board related to an exemplary embodiment of the present invention.

In the following, the above-described parasitic stub is briefly explained. As illustrated in FIG. 9, a printed wiring board 2 is configured by stacking many ground layers and wiring layers that are placed on each other via insulating layers. The ground layers and the wiring layers are each a conductor layer. FIG. 9 is depicted with omission of the insulating layers for the convenience of explanation, but actually, the insulating layer made of a dielectric substance such as a resin exists between the respective conductor layers.

At the ground layer, a ground plane 202 formed as a conductor pattern is provided.

The ground plane 202 functions as a ground. At the wiring layer, a signal wiring 203 formed also as a conductor pattern is provided. On the basis of the conductor pattern, the signal wiring 203 functions as a transmission line that propagates a predetermined electric signal.

Provided in the printed wiring board 2 are grounding through-holes 200a to 200c that penetrate the board 2 and connect to all the ground planes 202 provided at a plurality of the ground layers. The grounding through-holes 200a to 200c are written generically as grounding through-holes 200.

Likewise, provided in the printed wiring board 2 are signal through-holes 201a to 201d that penetrate the board 2 and connect to at least one of the signal wirings 203 provided at a plurality of the wiring layers. The signal through-holes 201a to 201d are written generically as signal through-holes 201. The signal through-hole 201 functions as a transmission line that plays a role of making connection to the signal wiring 203 and propagating an electric signal.

The signal through-holes 201a and 201b are connected to differential-signal signal wirings that transmit electric signals whose phases are inverted from each other. As illustrated in FIG. 9, the grounding through-holes 200a and 200b are arranged beside the signal through-holes 201a and 201b so as to form pairs with the signal through-holes 201a and 201b, respectively.

A clearance 204 is formed by hollowing out the conductor planes 202 of the ground layers. The clearance 204 is a non-conductor pattern for making a state where the ground planes 202 and the signal through-hole 201 are physically separated from each other. As illustrated in FIG. 9, the clearance 204 is formed around the signal through-holes 201a and 201b that propagate differential signals. Meanwhile, to make a configuration in which the ground planes 202 and the grounding through-hole 200 are physically contacted with each other, the clearance 204 is not formed around the grounding through-hole 200 at the all layers.

FIG. 10 is a second diagram illustrating a configuration of the printed wiring board 2 related to an exemplary embodiment of the present invention.

FIG. 10 is a diagram showing a sectional schematic view of the printed wiring board 2 illustrated in FIG. 9. As illustrated in FIG. 10, into each of the through-holes 201 and 202, a corresponding signal pin of an integrated circuit (IC) is inserted. The insulating layer 205 exists between the respective conductor layers, and electrically insulates the conductor layers from each other.

As illustrated in FIG. 10, the signal through-holes 201a and 201b penetrate the printed wiring board 2 from the upper surface to the lower surface. The signal through-holes 201a and 201b are connected to the signal wirings 203A of the first wiring layer from the upper side in the 20 printed wiring board 2, and are not connected to the second and following wiring layers at all. Accordingly, the signal through-holes 201a and 201b form "stub St" as illustrated in FIG. 10.

The stub St becomes a cause to increase "parasitic capacitance Pc" between the stub St and the conductor planes 202 as illustrated in FIG. 10. In a transmission line of an electric signal, parasitic capacitance Pc increases by existence of the stub St. As a result, impedance in the transmission line locally decreases. This leads to a cause for impedance mismatch that is not intended by a designer, and causes degradation in quality of high-frequency signal propagating through the transmission line.

As a method for dealing with the problem that the stub St is formed in the signal through-hole 201, there is a method called "back drilling method". The back drilling method is a method that cuts off and removes a parasitic stub portion in the through-hole. By this back drilling method, a parasitic stub can be physically removed.

As a measure for the above-described problem, patent literature 1 discloses a method for connecting ground planes to a grounding through-hole that makes potentials uniform by connecting the ground planes of respective ground layers with each other. The patent literature 1 discloses, as one of connecting methods, a method that connects the grounding through-hole only to the ground planes of the ground layers neighboring the wiring layer.

CITATION LIST

Patent Literature

[PTL 1] Published Japanese Translation of PCT International Publication for Patent Application (Kohyo) as No. 2007-522679

SUMMARY OF INVENTION

Technical Problem

The above-described back drilling method has an advantageous effect that a parasitic stub in a through-hole can be physically removed. However, the back drilling method requires a precise drilling process, and accordingly leads to increase in cost of the board.

In the connecting method for the ground wirings described in the patent literature 1, the ground planes in all the ground layers are formed in the same lattice shape. The ground planes other than those of the ground layers neighboring the wiring layer are not connected to the grounding through-hole, but extend to a wall surface of the grounding through-hole. In this configuration, limitation is imposed on the advantageous effect of reducing influence of a parasitic stub, this effect being obtained by non-contact between the grounding through-hole and the ground planes other than those of the ground layers neighboring the wiring layer.

One example of an object of the present invention is to provide a printed wiring board, an electronic device, and a wiring connection method that can solve the above-described problem.

Solution to Problem

A printed wiring board according to an embodiment of the present invention includes a wiring layer, a first ground layer, a second ground layer, a grounding through-hole, a signal through-hole, a first clearance, and a second clearance. The wiring layer includes a signal wiring. The first ground layer includes a first ground plane. The second ground layer is positioned between the wiring layer and the first ground layer, and includes a second ground plane. The grounding through-hole penetrates the wiring layer and the first and second ground layers, and connects the second ground plane. The signal through-hole penetrates the wiring layer and the first and second ground layers, and connects the signal wiring. The first clearance is formed in the first ground layer, is positioned around the signal through-hole and the grounding through-hole, and separates the first ground plane from the signal through-hole and the grounding through-hole. The second clearance is formed in the second ground layer, is positioned around the signal through-hole, and separates the second ground plane from the signal through-hole.

An electronic device according to an embodiment of the present invention includes the above-described printed wiring board.

A wiring connection method according to an embodiment of the present invention is used for a printed wiring board that includes: a wiring layer including a signal wiring; a first ground layer including a first ground plane; and a second ground layer positioned between the wiring layer and the first ground layer and including a second ground plane. This wiring connection method includes: connecting, to the second ground plane, a grounding through-hole penetrating the wiring layer and the first and second ground layers; connecting, to the signal wiring, a signal through-hole penetrating the wiring layer and the first and second ground layers; forming a first clearance in the first ground layer such that the first clearance is positioned around the signal through-hole and the grounding through-hole to separate the first ground plane from the signal through-hole and the grounding through-hole; and forming a second clearance in the second ground layer such that the second clearance is positioned around the signal through-hole to separate the second ground plane from the signal through-hole.

Advantageous Effects of Invention

According to an exemplary embodiment of the present invention, impedance discontinuity in a transmission line caused by a parasitic stub can be alleviated. For this reason, the printed wiring board enabling higher-speed data communication can be provided with low cost.

DESCRIPTION OF EMBODIMENTS

In the following, a printed wiring board according to an exemplary embodiment of the present invention is explained with reference to drawings.

Figure 1:
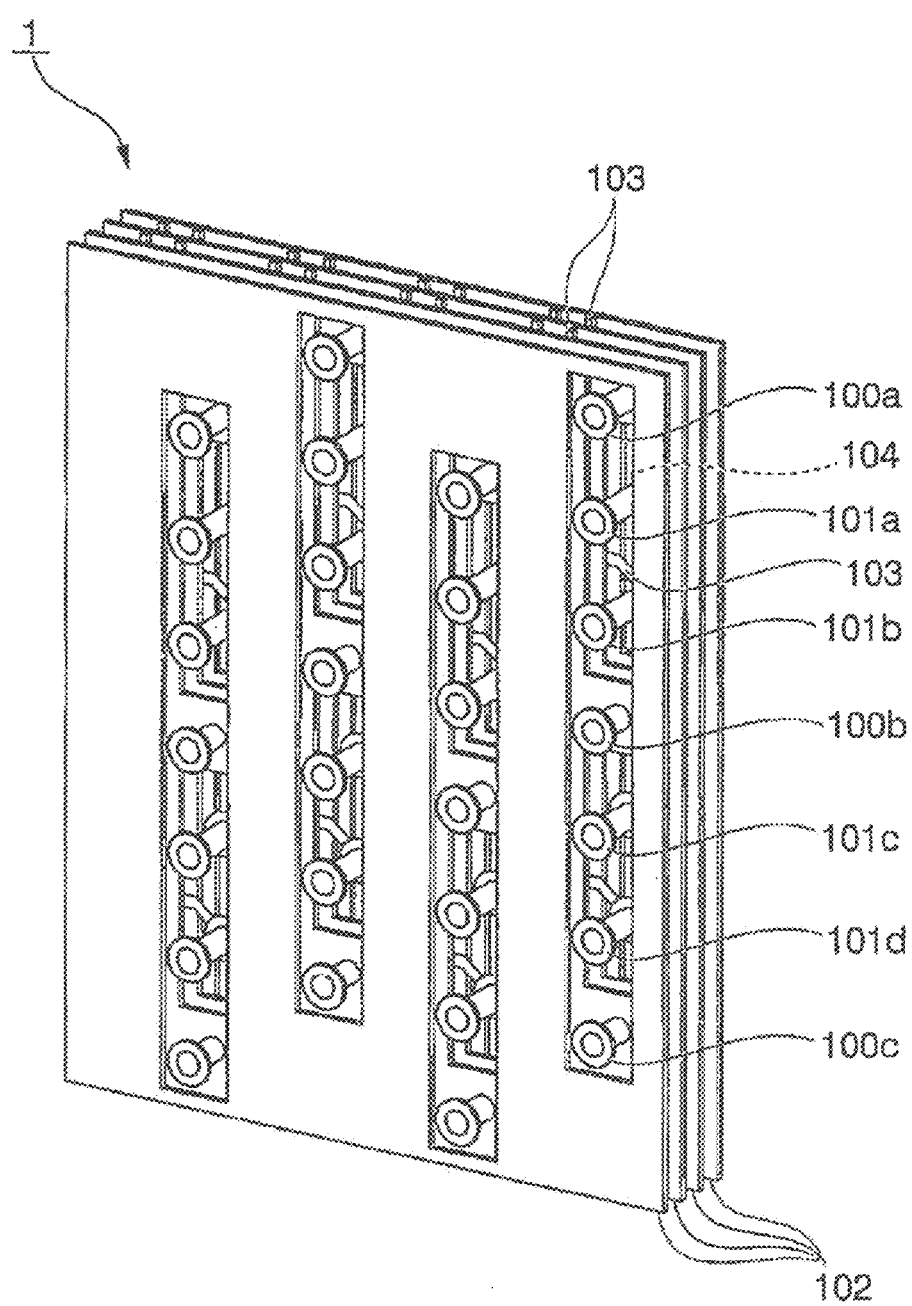
FIG. 1 is a diagram illustrating a configuration of a printed wiring board according to an exemplary embodiment of the present invention.

FIG. 1 is a first diagram illustrating a configuration of the printed wiring board according to an exemplary embodiment of the present invention.

As illustrated in FIG. 1, the printed wiring board 1 is configured by stacking a large number of ground layers and wiring layers via insulating layers. The ground layers and the wiring layers are each a conductor layer. Although insulating layers are omitted in FIG. 1 for convenience of explanation, the insulating layer actually exists between the respective conductor layers (refer to FIG. 3). The insulating layer is formed by a dielectric substance such as a resin.

The ground layer includes a ground plane 102 formed as a conductor pattern. This ground plane 102 functions as a ground. The wiring layer includes a signal wiring 103 formed as a conductor pattern. By the conductor pattern, this signal wiring 103 functions as a transmission line that propagates a predetermined electric signal.

The printed wiring board 1 includes grounding through-holes 100a to 100c that each penetrate the board 1 and each connect to at least one of the ground planes 102 of a plurality of the ground layers. The grounding through-holes 100a to 100c are written generically as grounding through-holes 100.

A plurality of the wiring layers each include the signal wiring 103. The printed wiring board 1 includes signal through-holes 101a to 101c that each penetrate the board 1 and each connect to at least one of the signal wirings 103. The signal through-holes 101a to 101c transmit differential signals. The signal through-holes 101a to 101c are written generically as signal through-holes 101. The signal through-hole 101 connects the signal wiring 103, and functions as a transmission line playing a role of propagating an electric signal.

The signal through-holes 101a and 101b are connected to the differential-signal signal wirings that transmit electric signals whose phases are inverted from each other. As illustrated in FIG. 1, the grounding through-hole 100a is arranged beside the signal through-hole 101a so as to form a pair with the signal through-hole 101a. The grounding through-hole 100b is arranged beside the signal through-hole 101b so as to form a pair with the signal through-hole 101b.

A clearance 104 is formed by hollowing out the conductor plane 102 of the ground layer. The clearance 104 is a non-conductor pattern for making a state where the ground plane 102 and the signal through-hole 101 are physically separated from each other.

The clearance 104 according to the present exemplary embodiment is formed around either one or both of the signal through-hole 101 and the grounding through-hole 100. The clearance 104 according to the present exemplary embodiment separates the signal through-hole 101 and the ground plane 102 from each other, or separates the grounding through-hole 100 and the ground plane 102 from each other. For example, in the ground layer illustrated on the most front side in FIG. 1, the clearance 104 is formed around the signal through-holes 101a and 101b and the grounding through-holes 100a and 100b.

In the printed wiring board 1, the grounding through-hole 100 is arranged beside the signal through-hole 101 so as to form a pair with the signal through-hole 101. For example, as illustrated in FIG. 1, the grounding through-hole 100a forms a pair with the signal through-hole 101a. The grounding through-hole 100b forms a pair with the signal through-hole 101b. The grounding through-holes 100a and 100b are arranged so as to sandwich the signal through-holes 101a and 101b therebetween. As illustrated in FIG. 1, the grounding through-hole 100b may also form a pair with another signal through-hole 101c arranged below the grounding through-hole 100b.

Figure 2A:
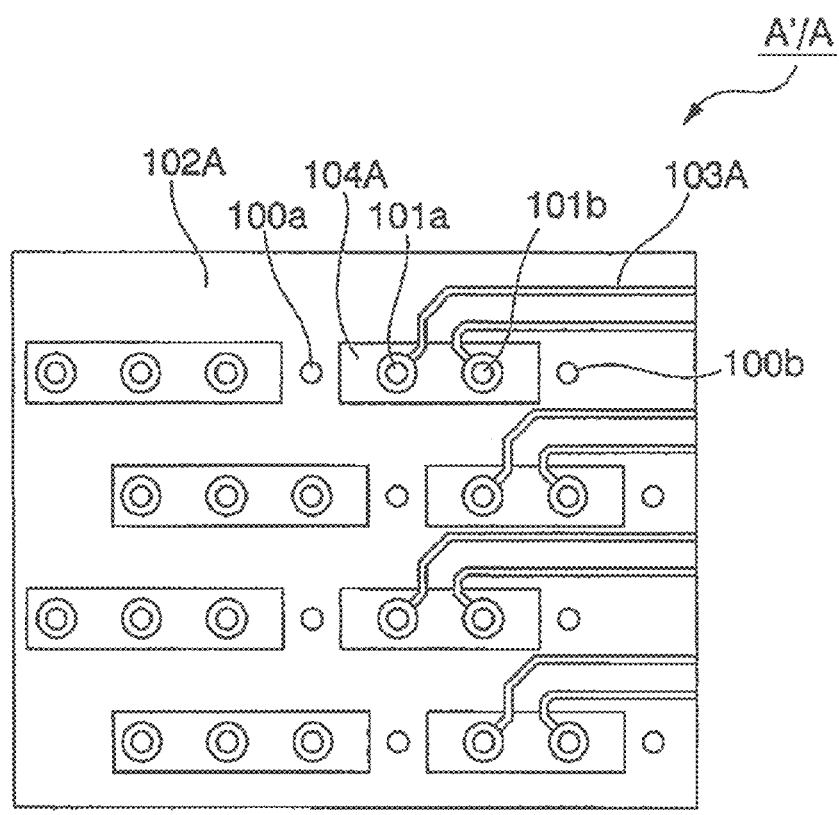
FIG. 2A is a diagram illustrating a configuration of the printed wiring board according to the exemplary embodiment of the present invention.
Figure 2B:
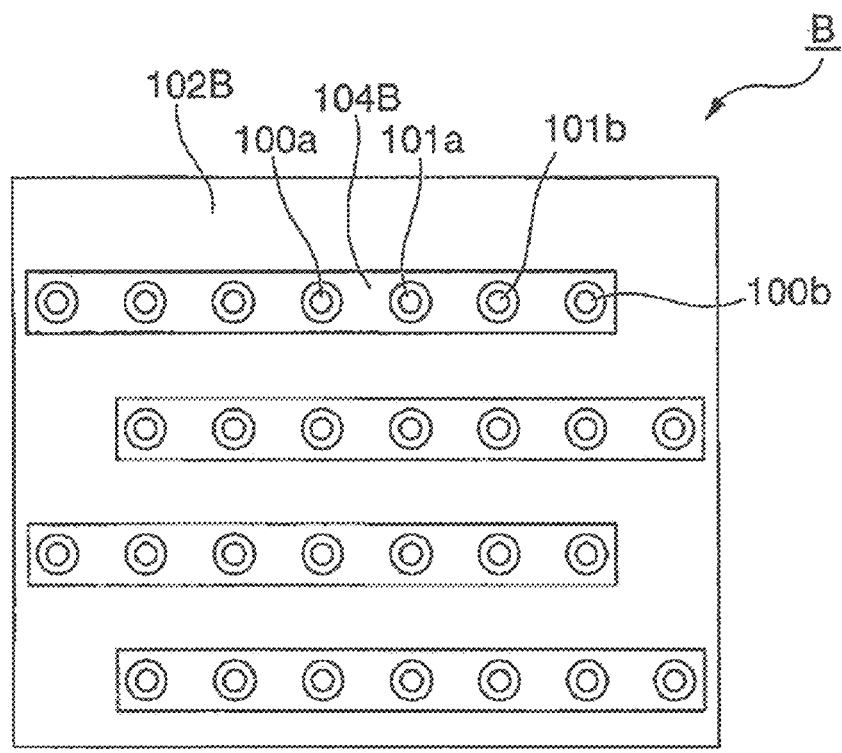
FIG. 2B is a diagram illustrating a configuration of the printed wiring board according to the exemplary embodiment of the present invention.

FIG. 2A and FIG. 2B are second diagrams illustrating a configuration of the printed wiring board according to the exemplary embodiment of the present invention.

The grounding through-hole 100 according to the present exemplary embodiment connects the ground plane 102 formed in a "neighboring ground layer" that is among a plurality of the ground layers and that neighbor the specific wiring layer. The grounding through-hole 100 according to the present exemplary embodiment is separated, by the clearance 104, from the ground planes 102 formed in the ground layers other than the neighboring ground layers. The "neighboring ground layer" indicates the ground layer that exists at the position shifted from the wiring layer via only one insulating layer (i.e., indicates the ground layer that "neighbors" the wiring layer via only one insulating layer).

FIG. 2A is a top view of a wiring layer A' and a ground layer A (a neighboring ground layer A) of the printed wiring board 1.

FIG. 2A illustrates arrangement in which the wiring layer A' exists on the front side of the paper, and the ground layer A exists at a position shifted via one insulating layer from the wiring layer A' toward the back side of the paper. In other words, the ground layer A is the "neighboring ground layer" that "neighbors" the wiring layer A'. As illustrated in FIG. 2A, a signal wiring 103A is formed in the wiring layer A'. A ground plane 102A and a clearance 104A are formed in the ground layer A.

As illustrated in FIG. 2A, the grounding through-holes 100a and 100b according to the present exemplary embodiment connect the ground plane 102A of the neighboring ground layer A. In other words, the clearance 104A is formed around the signal through-holes 101 (101a and 101b) so that the ground plane 102A and signal through-holes 101 are separated from each other. Meanwhile, around the grounding through-hole 100, the clearance 104A is not formed.

FIG. 2B is a top view of the ground layer B of the printed wiring board 1. The wiring layer does not exist at positions shifted via one insulating layer from an upper surface (the front side of the paper) and a lower surface (the back side of the paper) of the ground layer B. In other words, the ground layer B is not the neighboring ground layer. Such a ground layer B other than the neighboring ground layer is referred to as a non-neighboring ground layer in some cases. In this instance, in the non-neighboring ground layer B, a clearance 104B is formed at circumferences of the signal through-holes 101 (101a and 101b) and at circumferences of the grounding through-holes 100 such that the circumferences communicate with each other. Accordingly, the grounding through-holes 100 are separated, by the clearance 104B, from a ground plane 102B of the non-neighboring ground layer B.

Figure 3:
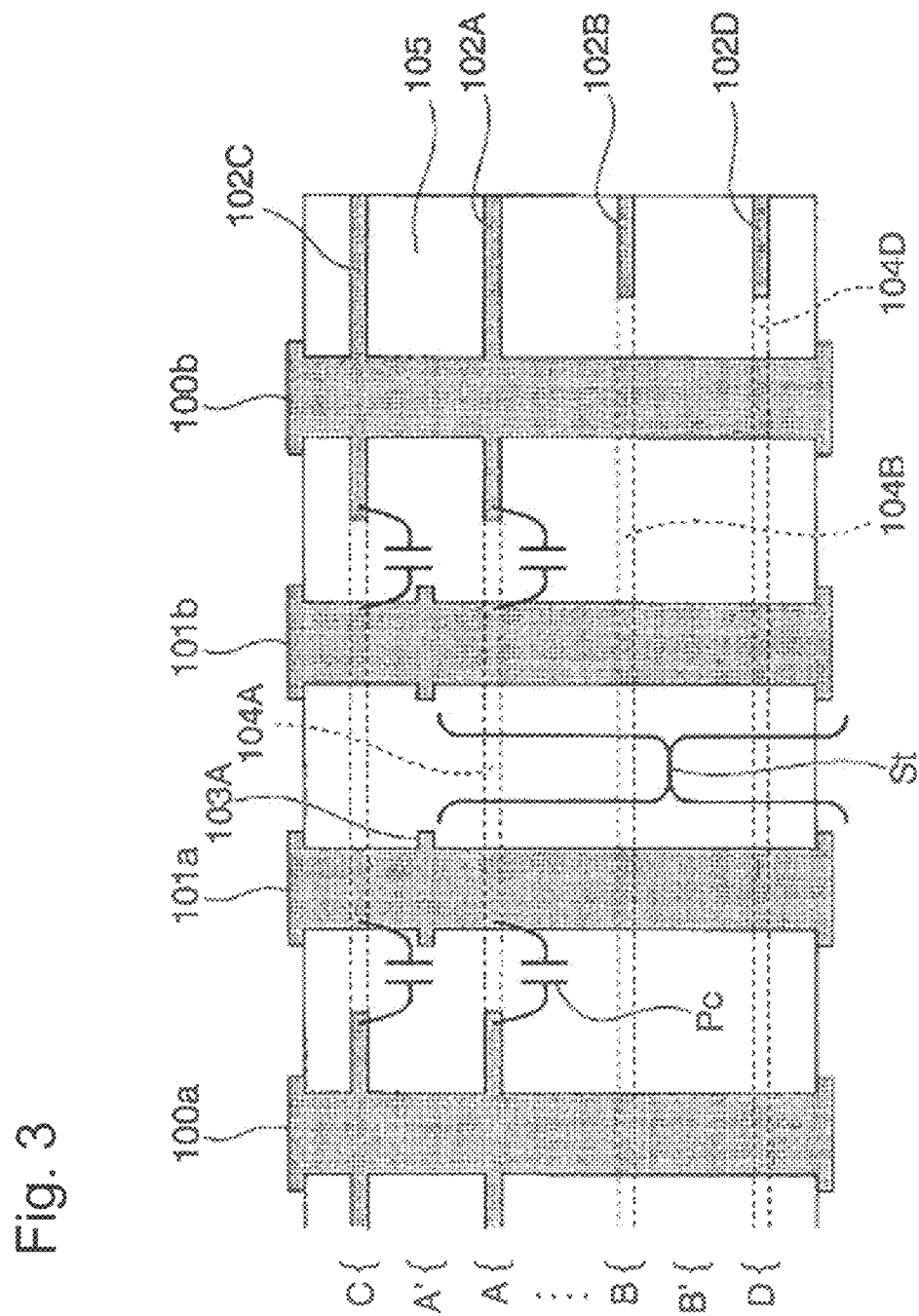
FIG. 3 is a diagram illustrating a configuration of the printed wiring board according to the exemplary embodiment of the present invention.

FIG. 3 is a third diagram illustrating a configuration of the printed wiring board according to the exemplary embodiment of the present invention.

FIG. 3 shows a sectional schematic view of the printed wiring board 1 illustrated in FIG. 1, FIG. 2A, and FIG. 2B.

Into each through-hole 100a, 100b, 101a, and 101b, a corresponding signal pin of an integrated circuit (IC) is inserted. The insulating layers 105 exist between the respective conductor layers to electrically insulate the conductor layers from each other.

As illustrated in FIG. 3, the signal through-holes 101a and 101b penetrate the printed wiring board 1 from the upper surface to the lower surface. The signal through-holes 101a and 101b are connected to the signal wiring 103A of the first wiring layer (wiring layer A') in the order from the upper side, and are not connected to the second and following wiring layers (wiring layer B' and the like) at all. For this reason, the signal through-holes 101a and 101b form stubs ST as illustrated in FIG. 3.

In the ground layer B, the ground plane 102B is formed. In a ground layer C, a ground plane 102C is formed. In a ground layer D, a ground plane 102D is formed. The ground planes 102A and 102C illustrated in FIG. 3 are connected to the grounding through-holes 100a and 100b since the ground layers A and C where the ground planes 102A and 102C are formed are the neighboring ground layers. Meanwhile, the ground planes 102B and 102D are not connected to the grounding through-holes 100a and 100b since the ground layers B and D where the ground planes 102B and 102D are formed are not the neighboring ground layers.

Thus, a clearance 104B is formed at a circumference of the grounding through-hole 100a and at a circumference of the grounding through-hole 100b such that the circumferences communicate with each other. As a result, a gap between the ground plane 102B and the signal through-hole 101 becomes large (refer to FIG. 3). As a result, parasitic capacitance Pc caused by the stub St and the ground plane 102B illustrated in FIG. 3 can be decreased. Since the relation between the ground plane 102D and a clearance 104D is the same, parasitic capacitance Pc caused by the stub St and the ground plane 102D can be decreased. Since the parasitic capacitance Pc that can be caused by existence of the stub St can be decreased, impedance discontinuity generated at a portion of the stub St can be alleviated in the transmission line configured by the signal wirings 103 and the signal through-hole 101.

As described above, the grounding through-holes 100a and 100b connect the ground planes 102A and 102C (refer to FIG. 3). Meanwhile, the grounding through-holes 100a and 100b are separated, by the clearances 104B and 104D, from the ground planes 102B and 102D.

Figure 4:
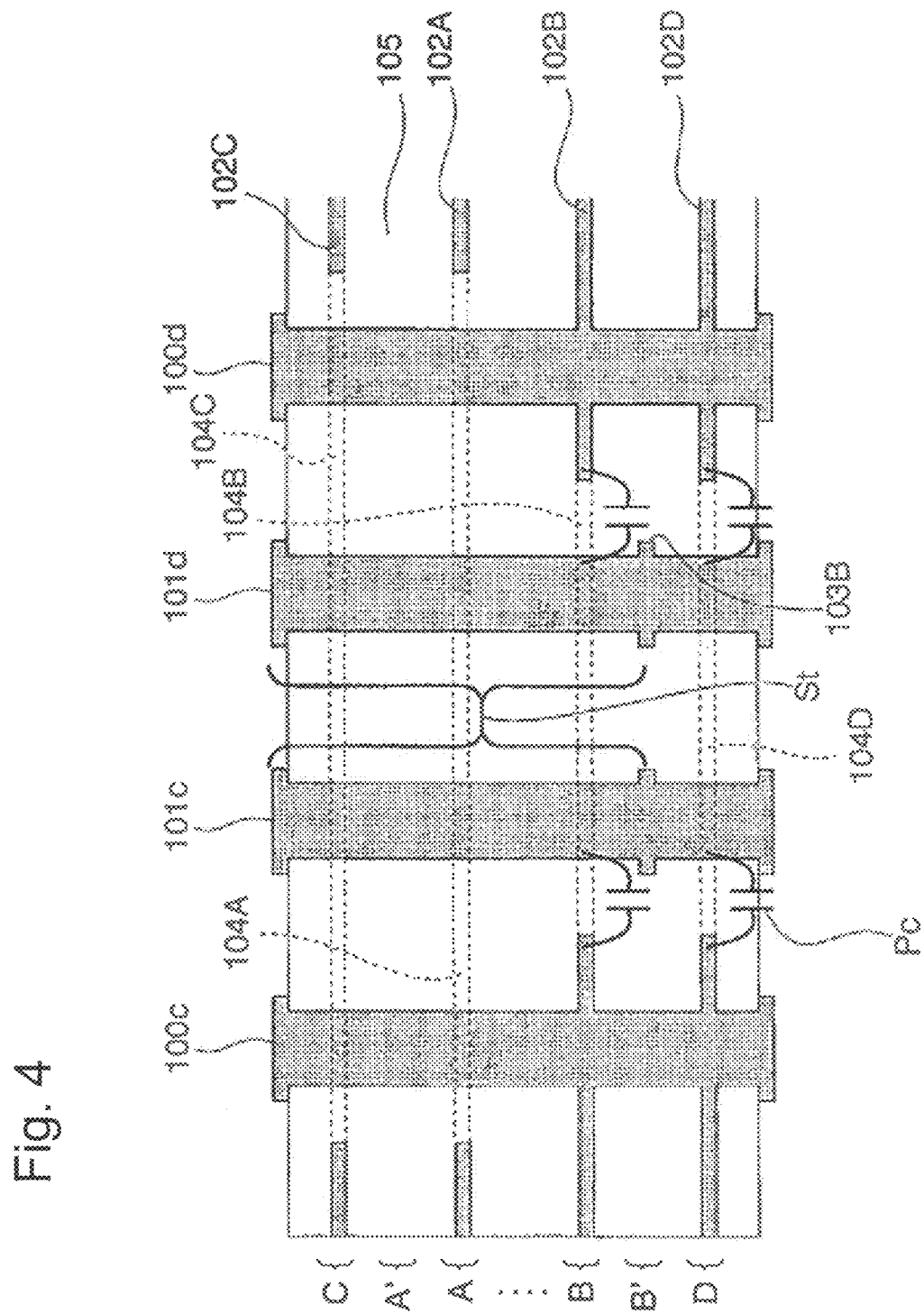
FIG. 4 is a diagram illustrating a configuration of the printed wiring board according to the exemplary embodiment of the present invention.

FIG. 4 is a fourth diagram illustrating a configuration of the printed wiring board according to the exemplary embodiment of the present invention.

As illustrated in FIG. 4, the printed wiring board 1 includes a pair of the grounding through-hole 100c and the signal through-hole 101c, and a pair of the grounding through-hole 100d and the signal through-hole 101d in addition to the through-holes illustrated in FIG. 3. In the present exemplary embodiment, the wiring layer B' is positioned between the ground layer B and the ground layer D, and includes signal wirings 103B. The signal wirings 103B are connected to the signal through-holes 101c and 101d. In this case, the grounding through-holes 100c and 100d connect the ground planes 102B and 102D formed in the neighboring ground layers B and D that neighbor the wiring layer B' (refer to FIG. 4). Meanwhile, the grounding through-holes 100c and 100d are separated, by the clearances 104A and 104C, from the ground planes 102A and 102C formed in the non-neighboring ground layers A and C that do not neighbor the wiring layer B'.

Thus, the clearance 104A is formed at a circumference of the grounding through-hole 100c and at a circumference of the grounding through-hole 100d such that the circumferences communicate with each other. As a result, a gap between the ground plane 102A and the signal through-hole 101 becomes large (refer to FIG. 4). As a result, parasitic capacitance Pc generated by the stub St and the ground plane 102A illustrated in FIG. 4 can be decreased. Since the relation between the ground plane 102C and the clearance 104C is the same, parasitic capacitance Pc generated by the stub St and the ground plane 102C can be decreased.

Figure 5:
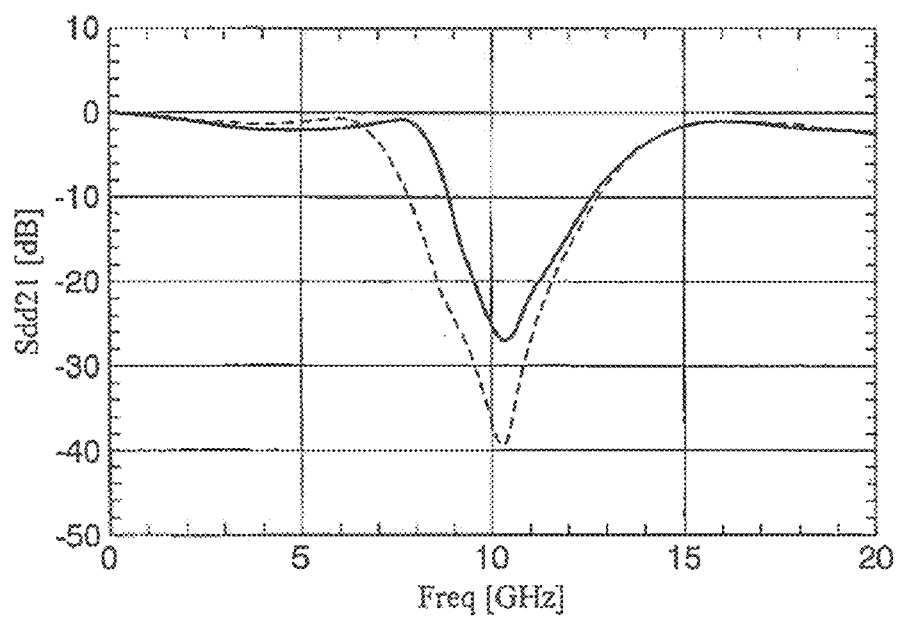
FIG. 5 is a graph representing electric properties of the printed wiring board according to the exemplary embodiment of the present invention and a printed wiring board related to the exemplary embodiment of the present invention.

FIG. 5 is a graph representing electric properties of the printed wiring board according to the exemplary embodiment of the present invention and the printed wiring board related to the exemplary embodiment of the present invention.

In the graph depicted in FIG. 5, the horizontal axis indicates a frequency (Freq [GHz]) of an electric signal, and the vertical axis indicates the transmission property (Sdd21 [dB]) of differential signals that propagate through signal through-holes. In FIG. 5, the solid line indicates the electric property of the printed wiring board 1 illustrated in FIG. 3. The broken line indicates the electric property of the printed wiring 2 illustrated in FIG. 10. The transmission property Sdd21 [dB] indicated by the vertical axis is an index indicating that differential signals are less attenuated to be transmitted to a transmission destination as a value of the index becomes closer to 0 (zero). As a value of Sdd21 becomes lower, differential signals are more attenuated, which indicates that the transmission property is deteriorated.

Figure 9:
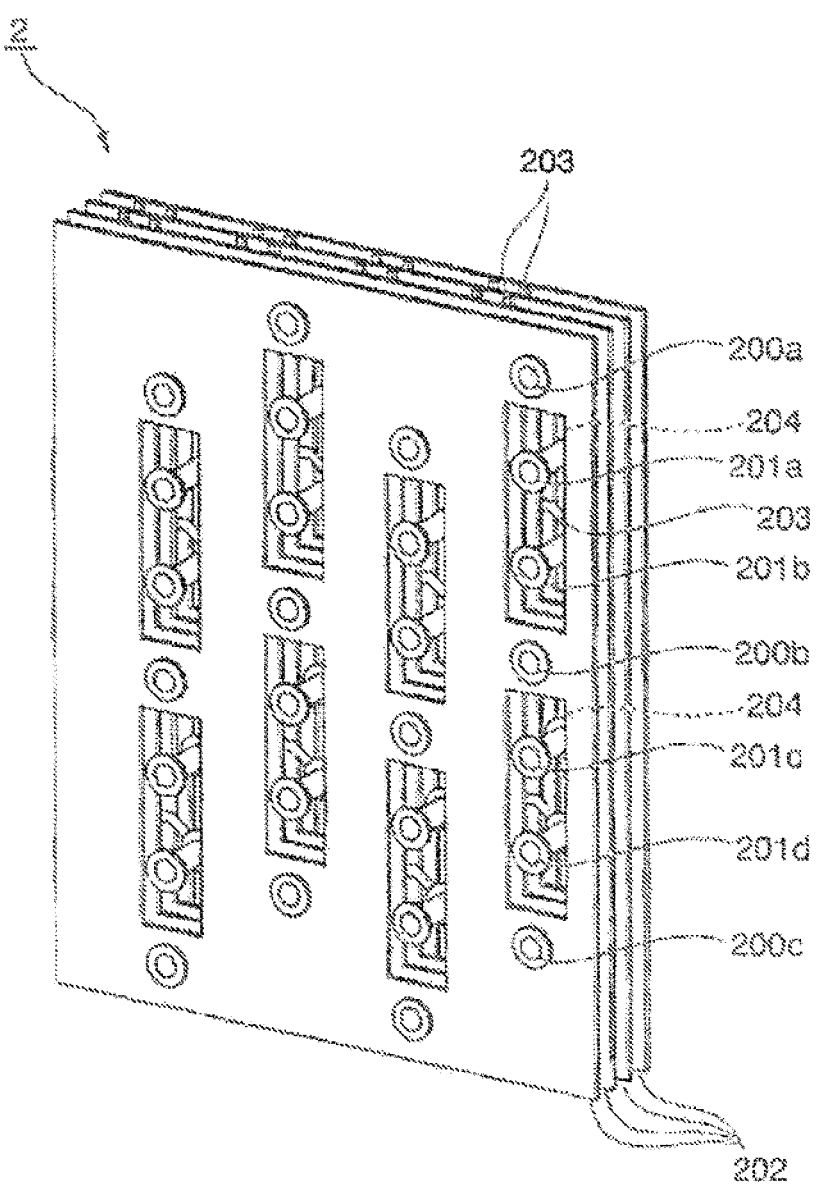
FIG. 9 is a diagram illustrating a configuration of a printed wiring board related to an exemplary embodiment of the present invention.
Figure 10:
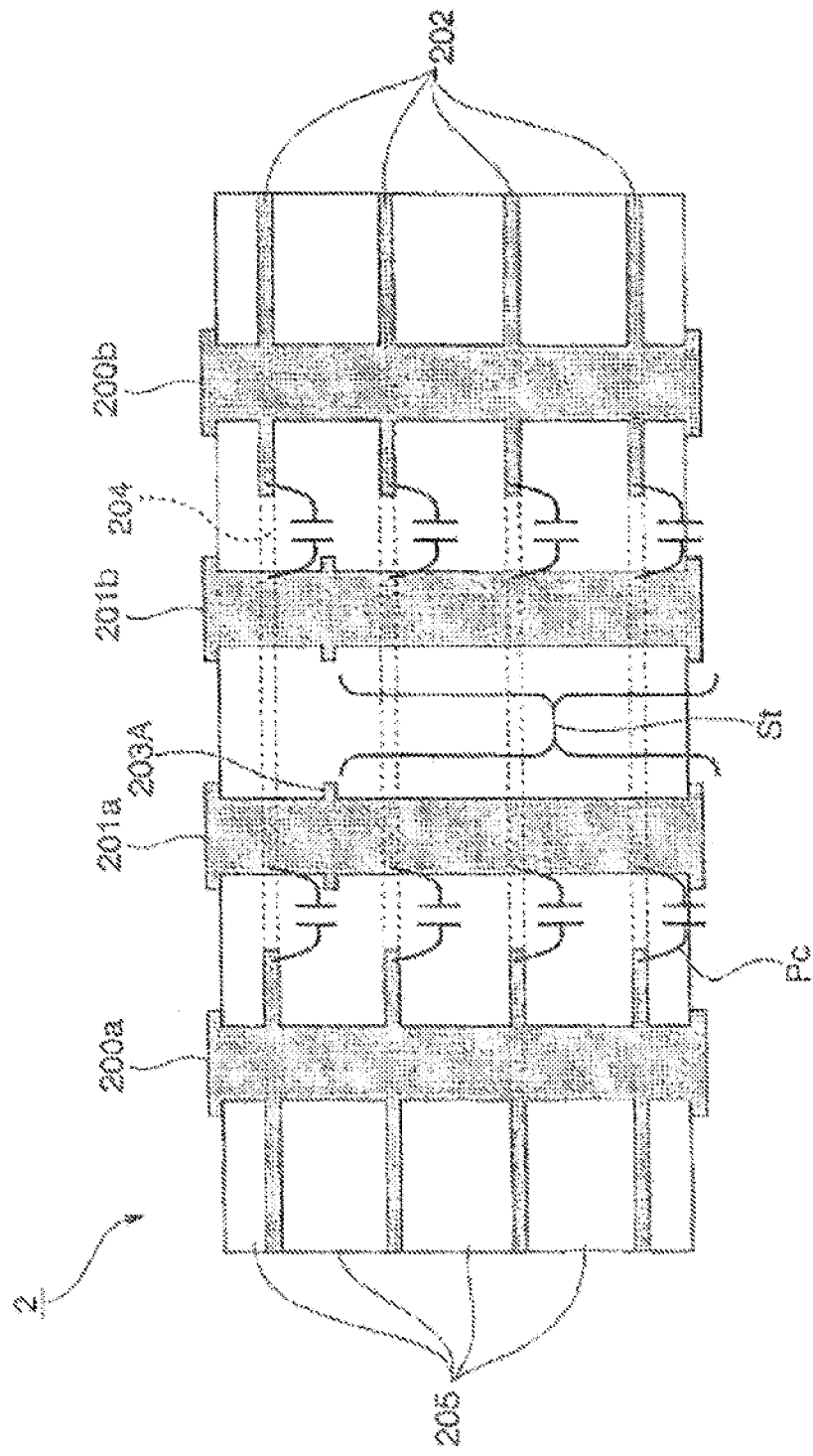
FIG. 10 is a diagram illustrating a configuration of the printed wiring board related to the exemplary embodiment of the present invention.

FIG. 5 is referred to, and in the case of the printed wiring board 2 illustrated in FIG. 9 and FIG. 10, attenuation of differential signals becomes conspicuous from a frequency range equal to or higher than 7 GHz. In contrast to this, in the case of the printed wiring board 1 illustrated in FIG. 1 to FIG. 4, attenuation of differential signals does not occur even at 8 GHz. In other words, according to the transmission property represented by FIG. 5, a frequency of differential signals in the printed wiring board 1 can be set to be higher than that in the printed wiring board 2 by about 1 GHz.

This is attributed to decreasing of parasitic capacitance Pc generated between portions of stubs St of the signal through-holes 101 (201) and the ground planes 102 (202) as in FIG. 10, FIG. 3 and FIG. 4. In other words, decreasing this parasitic capacitance component "C" makes it possible to shift, as a whole, to a high-frequency side, a resonance frequency (a frequency giving an attenuation peak represented in FIG. 5) that is determined on the basis of a product of the parasitic capacitance component "C" and a parasitic induction component "L" existing in the wirings and the stubs St.

As described above, according to the present exemplary embodiment, impedance discontinuity in the transmission line caused by the parasitic stubs can be alleviated so that the printed wiring board enabling higher-speed data communication can be provided with low cost.

Figure 6:
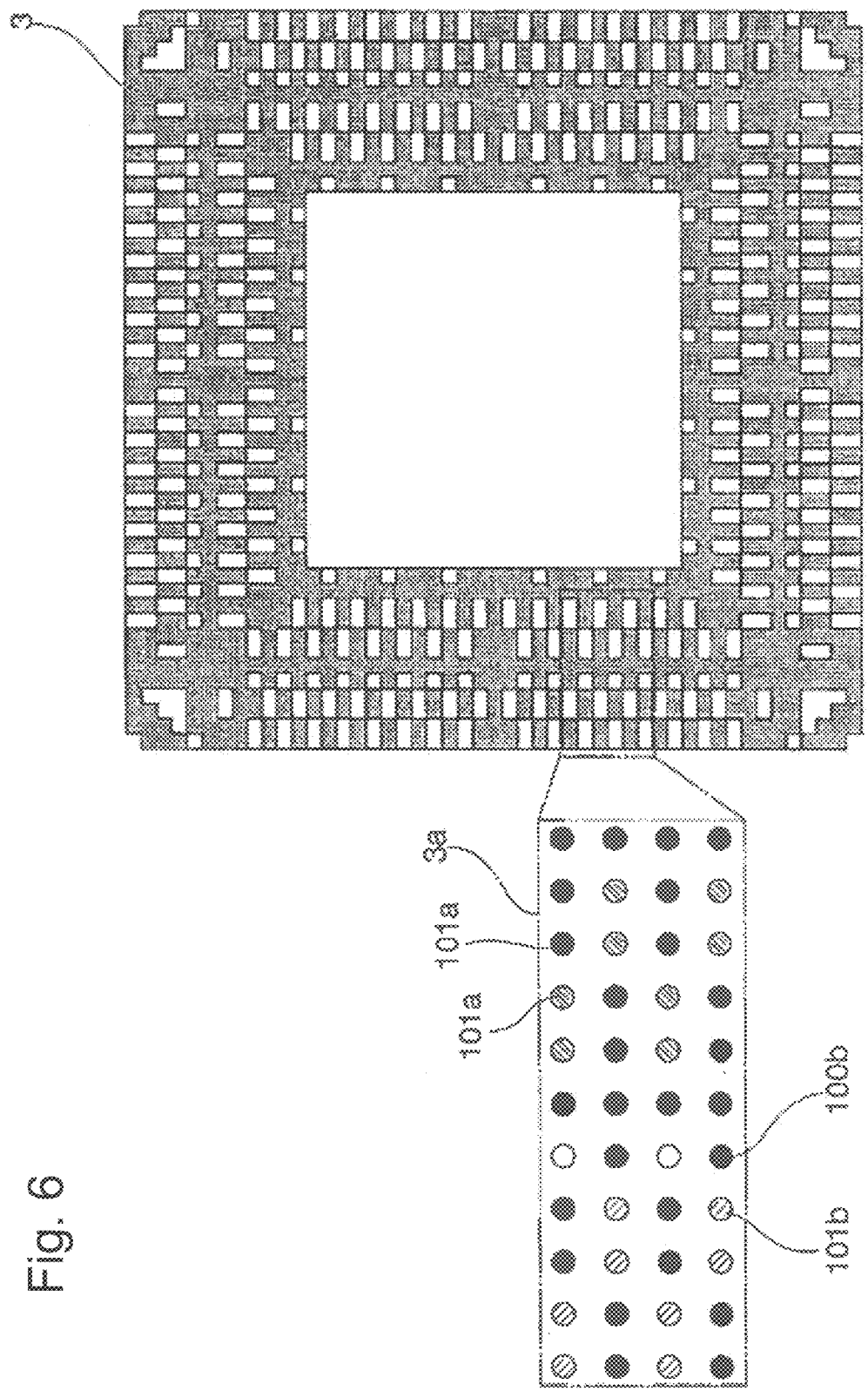
FIG. 6 is a diagram illustrating an LSI terminal formed on the printed wiring board according to the exemplary embodiment of the present invention.

FIG. 6 illustrates an LSI terminal formed on the printed wiring board according to the exemplary embodiment of the present invention.

The printed wiring board 1 according to the present exemplary embodiment includes an LSI (Large Scale Integration) terminal 3 as in FIG. 6, for example. As illustrated in FIG. 6, the LSI terminal 3 is constituted by a large number of through-holes corresponding to signal pins of a connected LSI.

A partial LSI terminal 3a illustrated in FIG. 6 is an enlarged region of a part of the LSI terminal 3. As illustrated in FIG. 6, the LSI terminal 3 includes a plurality of grounding through-holes 100 and a plurality of signal through-holes 101. As illustrated in FIG. 6, in the partial LSI terminal 3a, a grounding through-hole 100a and a signal through-hole 101a form a pair, and a grounding through-hole 100b and a signal through-hole 101b form a pair.

Figure 7:
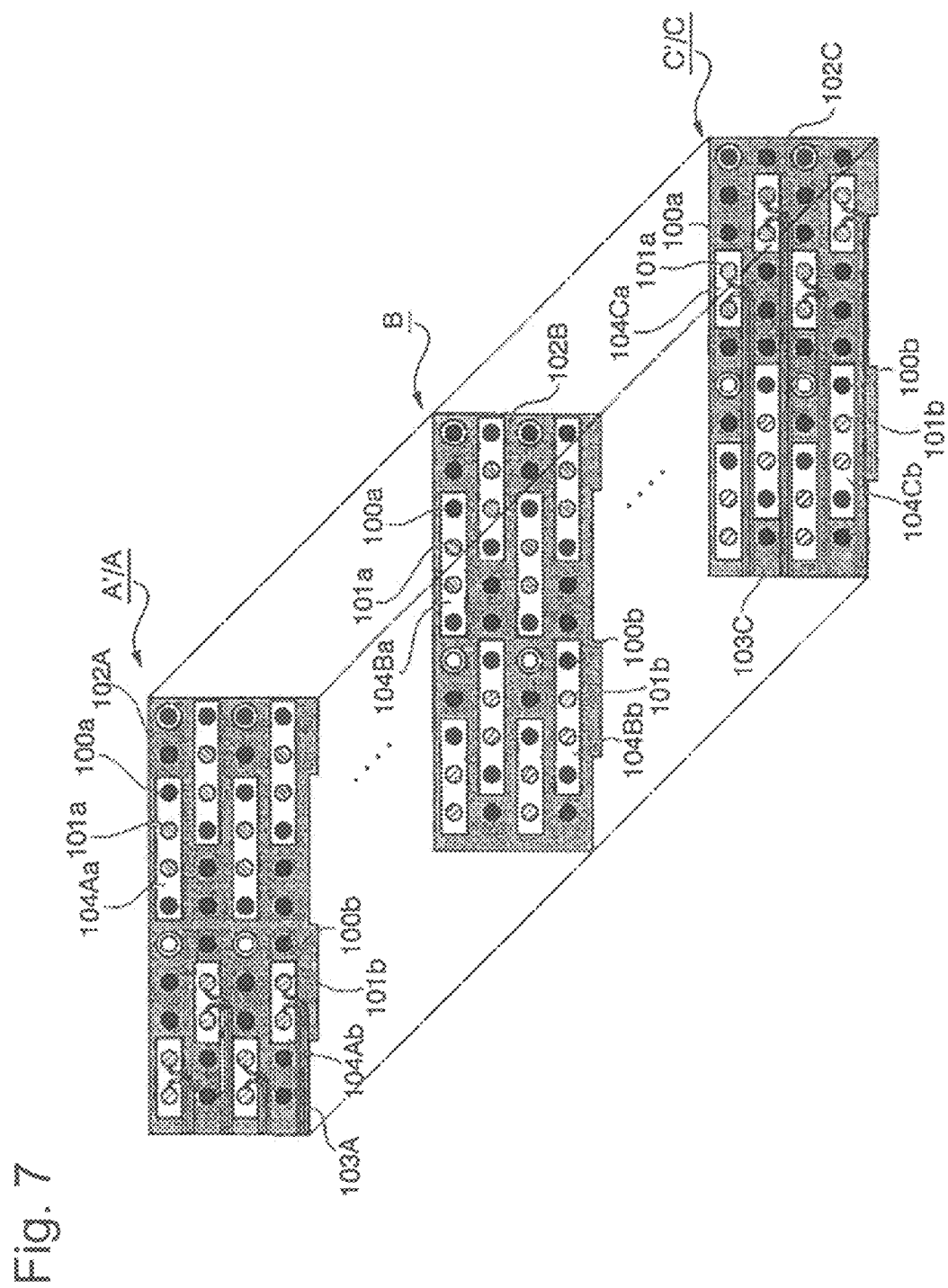
FIG. 7 is a diagram illustrating a layer configuration of the LSI terminal according to the exemplary embodiment of the present invention.

FIG. 7 is a diagram illustrating a layer configuration of the LSI terminal according to the exemplary embodiment of the present invention. With reference to FIG. 7, description is made about the layer configuration of each through-hole 100, 101 formed in the partial LSI terminal 3a illustrated in FIG. 6.

First, a ground layer A and a wiring layer A' illustrated in FIG. 7 are explained (refer to the upper left in FIG. 7). The ground layer A exists on the lower surface of the wiring layer A' (on the back side of the paper) to neighbor the wiring layer A'. A signal through-hole 101b is connected to a signal wiring 103A formed in the wiring layer A'. Accordingly, a grounding through-hole 100b forming the pair with the signal through-hole 101b connects a ground plane 102A formed in the ground layer A. A clearance 104Ab formed in the ground layer A is formed around the signal through-hole 101b, but is not formed around the grounding through-hole 100b (refer to upper left in FIG. 7).

A signal through-hole 101a is not connected to a wiring formed in the wiring layer A'. The signal through-hole 101a is not connected to a signal wiring (not illustrated) of the wiring layer that neighbors the lower surface of the ground layer A (on the back side of the paper) as well. In this case, a grounding through-hole 100a forming the pair with the signal through-hole 101a does not connect the ground plane 102A formed in the ground layer A. In other words, a clearance 104Aa formed in the ground layer A is formed around the signal through-hole 101a and the grounding through-hole 100a (refer to the upper left in FIG. 7).

Next, a ground layer B illustrated in FIG. 7 is explained (refer to the center in FIG. 7). In the range of the partial LSI terminal 3a, the ground layer B does not include any wiring through-hole 101 that connect to signal wirings of the wiring layers neighboring the upper surface (on the front side of the paper) and the lower surface (on the back side of the paper) of the ground layer B. In this case, both of the grounding through-holes 100a and 100b forming the pairs with the signal through-holes 101a and 101b do not connect a ground plane 102B formed in the ground layer B (refer to the center in FIG. 7).

Next, a ground layer C illustrated in FIG. 7 is explained (refer to the lower right in FIG. 7). The ground layer C exists on the lower surface (on the back side of the paper) of a wiring layer C' to neighbor the wiring layer C'. The signal through-hole 101a is connected to a signal wiring 103C formed in the wiring layer C'. Accordingly, the grounding through-hole 100a forming the pair with the signal through-hole 101a connects a ground plane 102C formed in the ground layer C. A clearance 104Ca formed in the ground layer C is formed around the signal through-hole 101a, but is not formed around the grounding through-hole 100a (refer to the lower right in FIG. 7).

The signal through-hole 101b is not connected to a wiring formed in the wiring layer C'. The signal through-hole 101b is not connected to a signal wiring (not illustrated) of the wiring layer that neighbors the lower surface (on the back side of the paper) of the ground layer C, as well. In this case, the grounding through-hole 100b forming the pair with the signal through-hole 101b does not connect the ground plane 102C formed in the ground layer C. In other words, a clearance 104Cb formed in the ground layer C is formed around the signal through-hole 101b and the grounding through-hole 100b (refer to the lower right in FIG. 7).

As in the above, even when the LSI terminal 3 is configured in the printed wiring board 1, the exemplary embodiment of the present invention can be applied by making the connection as described above.

Figure 8:
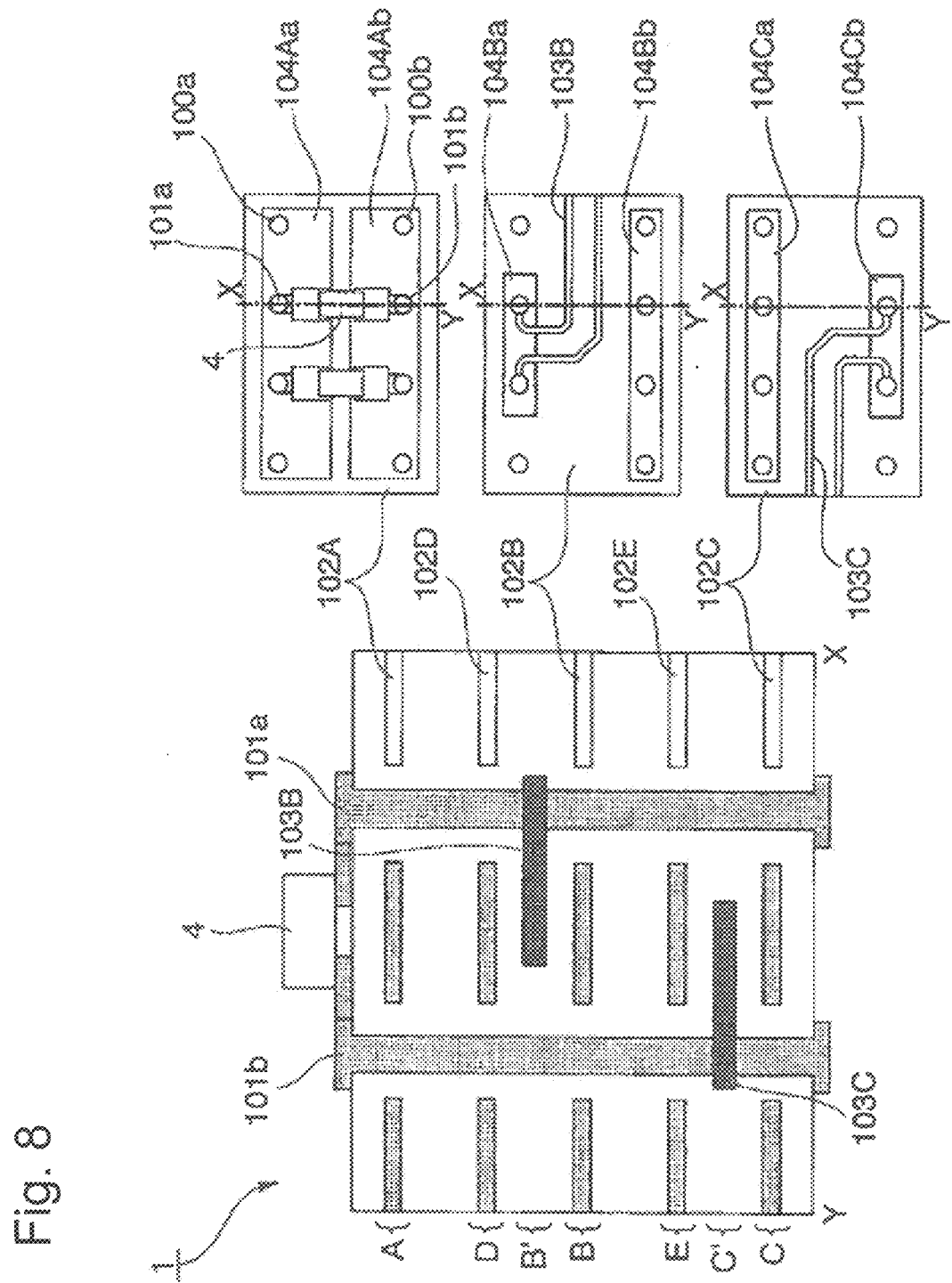
FIG. 8 is a diagram illustrating through-hole designing for connecting an AC coupling capacitor according to the exemplary embodiment of the present invention.

FIG. 8 is a diagram illustrating through-hole designing for connecting an AC coupling capacitor according to the exemplary embodiment of the present invention.

The left side in FIG. 8 illustrates a sectional configuration of the printed wiring board 1. The capacitor 4 is a capacitor for AC coupling. The capacitor 4 is arranged on a transmission line for removing a DC component of a high-frequency signal. The right side in FIG. 8 represents a top view of respective conductor layers constituting the printed wiring board 1. A section at the dashed line X-Y in the top view corresponds to the sectional view represented on the left side in FIG. 8.

In a ground layer A, a ground plate 102A and clearances 104Aa and 104Ab are formed. The ground layer A does not neighbor the wiring layer in the region illustrated in the drawing. For this reason, grounding through-holes 100a and 100b do not connect the ground plane 102A (refer to the upper right in FIG. 8).

In a ground layer B, a ground plate 102B and clearances 104Ba and 104Bb are formed. The ground layer B is the neighboring ground layer that neighbors a wiring layer B'. A signal wiring 103B formed in the wiring layer B' is connected to a signal through-hole 101a. Accordingly, the grounding through-hole 100a forming the pair with the signal through-hole 101a connects the ground plane 102B of the ground layer B (refer to the right center in FIG. 8). As illustrated in the left side in FIG. 8, a ground layer D existing at the position shifted from the wiring layer B' by one layer to the upper side is the neighboring ground layer of the wiring layer B', as well. For this reason, a ground plane 102D is connected to the grounding through-hole 100a likewise.

A signal through-hole 101b is not connected to the wiring formed in the wiring layer B'. Accordingly, the grounding through-hole 100b forming the pair with the signal through-hole 101b is separated, by the clearance 104Bb, from the ground plane 102B of the ground layer B (refer to the right center in FIG. 8).

In a ground layer C, a ground plate 102C and clearances 104Ca and 104Cb are formed. The ground layer C is the neighboring ground layer that neighbors a wiring layer C'. A signal wiring 103C formed in the wiring layer C' is connected to the signal through-hole 101b. Accordingly, the grounding through-hole 100b forming the pair with the signal through-hole 101b connects the ground plane 102C of the ground layer C (refer to the lower right in FIG. 8). As illustrated in the left side in FIG. 8, a ground layer E existing at the position shifted upward by one layer from the wiring layer C' is also the neighboring ground layer of the wiring layer C', as well. For this reason, a ground plane 102E is connected to the grounding through-hole 100b likewise.

The signal through-hole 101a is not connected to the wiring formed in the wiring layer C'. Accordingly, the grounding through-hole 100a forming the pair with the signal through-hole 101a is separated, by the clearance 104Ca, from the ground plane 102C of the ground layer C (refer to the lower right in FIG. 8).

Thus, in the printed wiring board 1 according to the present exemplary embodiment, at the upper surface and the lower surface of the signal wiring 103B, e.g., there are the ground planes 102B and 102D connected to the grounding through-hole 100a forming the pair with the signal through-hole 101a that connects to the signal wiring 103B.

Likewise, at the upper surface and the lower surface of the signal wiring 103C, there are the ground planes 102C and 102E connected to the grounding through-hole 100b forming the pair with the signal through-hole 101b that connects to the signal wiring 103C.

In other words, the grounding through-hole 100 connects the ground planes 102 formed in the ground layers that neighbor the upper surface and the lower surface of the wiring layer in which the signal through-holes 101 forming a pair each other are formed. The signal wiring 103 extends in a state where the signal wiring 103 is interposed between the ground planes 102 formed in the ground layers that neighbor the upper surface and the lower surface of the signal wiring 103.

According to the above-described printed wiring board 1, parasitic capacitance Pc generated in the stub St is decreased. For this purpose, the grounding through-hole 100 does not connect all the ground planes 102, and connects only a part of the ground planes 102. In this case, there is caused a concern that electrical coupling among the ground planes 102 is weaken, so that a ground potential cannot be maintained as a whole, and as a result, the ground plane 102 cannot make shielding against electromagnetic interference between the signal wirings.

However, as described above, according to the present exemplary embodiment, the grounding through-hole 100 connects at least the ground plane 102 that neighbor the upper surface and the lower surface of the wiring layer. By this configuration, a ground potential is effectively given, via the grounding through-hole 100, to the ground planes 102 closest to each signal wiring. For this reason, the grounding through-hole 100 can sufficiently attain the shielding effect for each signal wiring 103 by only the minimum connection. Therefore, according to the present exemplary embodiment, even when no connection between the grounding through-hole 100 and a part of the ground planes 102 is made for decreasing parasitic capacitance Pc, interference between the signal wirings 103 does not occur.

In the above, the invention of the present application is shown and is described above with reference to the exemplary embodiments, but the invention of the present application is not limited to the above-described exemplary embodiments. It would be understood that a person skilled in the art can variously change the configuration or details without departing from the scope of the invention of the present application defined by claims.

This application is based upon and claims the benefit of priority from Japanese patent application No. 2013-010899, filed on Jan. 24, 2013, the disclosure of which is incorporated herein in its entirety by reference.

INDUSTRIAL APPLICABILITY

The present invention can be applied to a printed wiring board, an electronic device, and a wiring connection method.

REFERENCE SIGNS LIST 1, 2 . . . printed wiring board
100, 200 . . . grounding through-hole
101, 201 . . . signal through-hole
102, 202 . . . ground plane
103, 203 . . . signal wiring
104, 204 . . . clearance
3 . . . LSI terminal
4 . . . AC coupling capacitor

The invention claimed is:

1. A printed wiring board comprising:
 a wiring layer including signal wirings for differential signals;
 a first ground layer including a first ground plane;
 a second ground layer positioned between the wiring layer and the first ground layer and including a second ground plane;
 a grounding through-hole penetrating the wiring layer and the first and second ground layers, and connected to the second ground plane;
 a signal through-hole penetrating the wiring layer and the first and second ground layers, and connected to the signal wirings;
 a first clearance formed in the first ground layer, positioned around the signal through-hole and the grounding through-hole, and separating the first ground plane from the signal through-hole and the grounding through-hole; and
 a second clearance formed in the second ground layer, positioned around the signal through-hole, and separating the second ground plane from the signal through-hole.

2. The printed wiring board according to claim 1, wherein the second ground layer neighbors the wiring layer such that only an insulating layer is interposed between the wiring layer and the second ground layer.

3. The printed wiring board according to claim 2, wherein the grounding through-hole is arranged beside the signal through-hole so as to form a pair with the signal through-hole.

4. The printed wiring board according to claim 3, further comprising:
 a third ground layer positioned on an opposite side of the wiring layer from the second ground layer, and including a third ground plane; and
 a third clearance formed in the third ground layer, positioned around the signal through-hole, and separating the third ground plane from the signal through-hole;
 wherein the third ground layer neighbors the wiring layer such that only an insulating layer is interposed between the wiring layer and the third ground layer, and
 the signal wirings extend in a state where the signal wirings are interposed between the second ground plane and the third ground plane.

5. An electronic device comprising a printed wiring board, wherein the printed wiring board comprises:
 a wiring layer including signal wirings for differential signals;
 a first ground layer including a first ground plane;
 a second ground layer positioned between the wiring layer and the first ground layer and including a second ground plane;
 a grounding through-hole penetrating the wiring layer and the first and second ground layers, and connected to the second ground plane;
 a signal through-hole penetrating the wiring layer and the first and second ground layers, and connected to the signal wirings;
 a first clearance formed in the first ground layer, positioned around the signal through-hole and the grounding through-hole, and separating the first ground plane from the signal through-hole and the grounding through-hole; and a second clearance formed in the second ground layer, positioned around the signal through-hole, and separating the second ground plane from the signal through-hole.

6. A wiring connection method used for a printed wiring board comprising: a wiring layer including signal wirings for differential signals; a first ground layer including a first ground plane; and a second ground layer positioned between the wiring layer and the first ground layer and including a second ground plane, the method comprising:

connecting, to the second ground plane, a grounding through-hole penetrating the wiring layer and the first and second ground layers;

connecting, to the signal wirings, a signal through-hole penetrating the wiring layer and the first and second ground layers;

forming a first clearance in the first ground layer such that the first clearance is positioned around the signal through-hole and the grounding through-hole to separate the first ground plane from the signal through-hole and the grounding through-hole; and forming a second clearance in the second ground layer such that the second clearance is positioned around the signal through-hole to separate the second ground plane from the signal through-hole.

* * * * *